(12) United States Patent
Fuergut et al.

(10) Patent No.: US 9,123,806 B2
(45) Date of Patent: Sep. 1, 2015

(54) METHOD OF MANUFACTURING A SEMICONDUCTOR DEVICE

(71) Applicant: Infineon Technologies AG, Neubiberg (DE)

(72) Inventors: Edward Fuergut, Dasing (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/282,946

(22) Filed: May 20, 2014

(65) Prior Publication Data

US 2014/0327071 A1 Nov. 6, 2014

Related U.S. Application Data

(62) Division of application No. 13/397,328, filed on Feb. 15, 2012, now Pat. No. 8,749,029.

(51) Int. Cl.
| | |
|---|---|
| *H01L 29/78* | (2006.01) |
| *H01L 23/31* | (2006.01) |
| *H01L 29/06* | (2006.01) |
| *H01L 29/66* | (2006.01) |
| *H01L 21/56* | (2006.01) |
| *H01L 23/00* | (2006.01) |

(52) U.S. Cl.
CPC ........ *H01L 29/7827* (2013.01); *H01L 23/3107* (2013.01); *H01L 23/3185* (2013.01); *H01L 29/0657* (2013.01); *H01L 29/66666* (2013.01); *H01L 21/56* (2013.01); *H01L 24/05* (2013.01); *H01L 2924/1305* (2013.01); *H01L 2924/13055* (2013.01); *H01L 2924/13091* (2013.01); *H01L 2924/1461* (2013.01)

(58) Field of Classification Search
USPC .......................................... 257/626
See application file for complete search history.

(56) References Cited

U.S. PATENT DOCUMENTS

| | | | |
|---|---|---|---|
| 4,537,654 A | 8/1985 | Berenz et al. | |
| 4,982,266 A | 1/1991 | Chatterjee | |
| 5,040,020 A | 8/1991 | Rauschenbach et al. | |
| 5,333,469 A | 8/1994 | Hullar et al. | |
| 5,511,428 A | 4/1996 | Goldberg et al. | |
| 5,814,889 A | 9/1998 | Gaul | |
| 6,843,661 B2* | 1/2005 | Momenpour et al. | 439/73 |
| 7,923,350 B2 | 4/2011 | Mahler et al. | |
| 8,310,024 B2 | 11/2012 | Reefman et al. | |
| 2002/0115234 A1 | 8/2002 | Siniaguine | |
| 2007/0082480 A1 | 4/2007 | Kinzer et al. | |
| 2009/0087712 A1 | 4/2009 | Huang et al. | |
| 2009/0146760 A1 | 6/2009 | Reefman et al. | |
| 2010/0059864 A1 | 3/2010 | Mahler et al. | |
| 2011/0233754 A1 | 9/2011 | Meyer-Berg | |
| 2011/0248396 A1* | 10/2011 | Liu et al. | 257/686 |
| 2012/0280334 A1* | 11/2012 | Yosida et al. | 257/415 |

* cited by examiner

*Primary Examiner* — Thao P Le
(74) *Attorney, Agent, or Firm* — Slater & Matsil, L.L.P.

(57) ABSTRACT

The method includes providing a semiconductor chip having a first main face and a second main face opposite the first main face. The semiconductor chip includes an electrical device adjacent to the first main face. Material of the semiconductor chip is removed at the second main face except for a predefined portion so that a non-planar surface remains at the second main face.

20 Claims, 7 Drawing Sheets

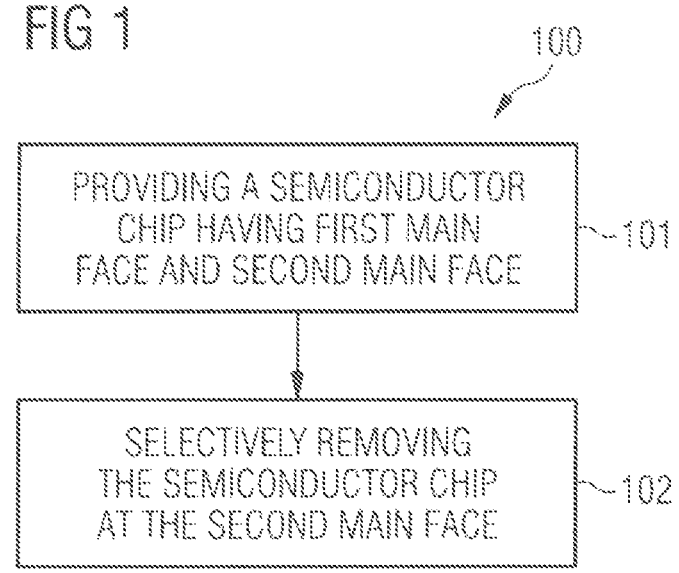

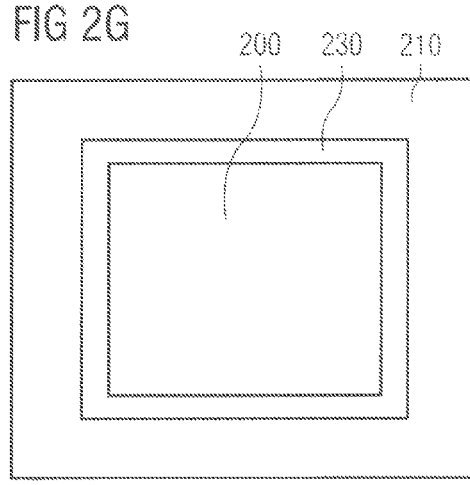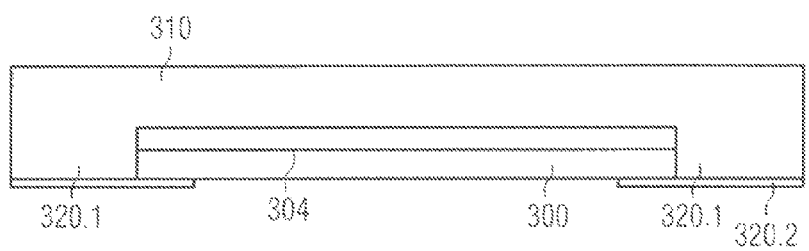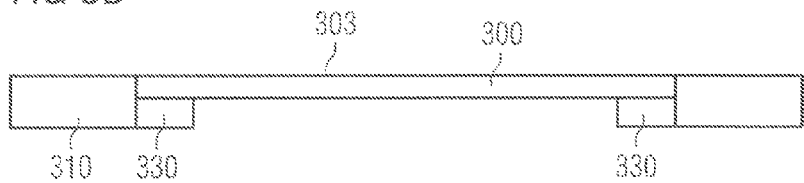

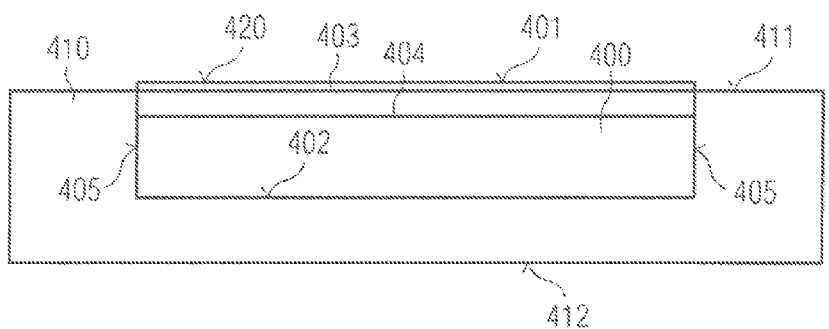
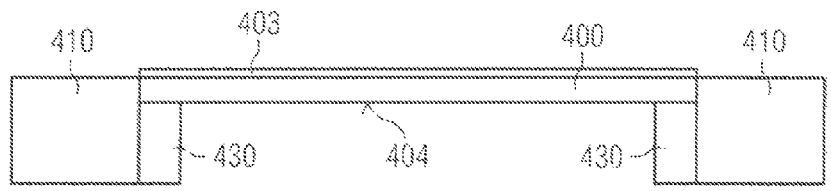

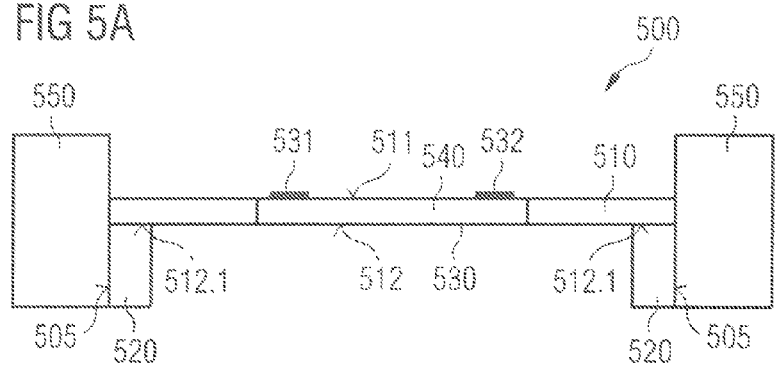
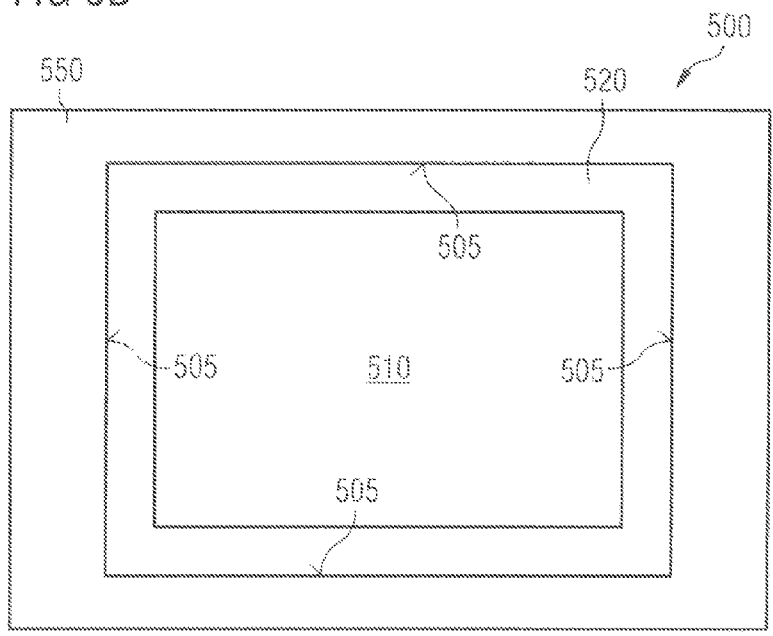

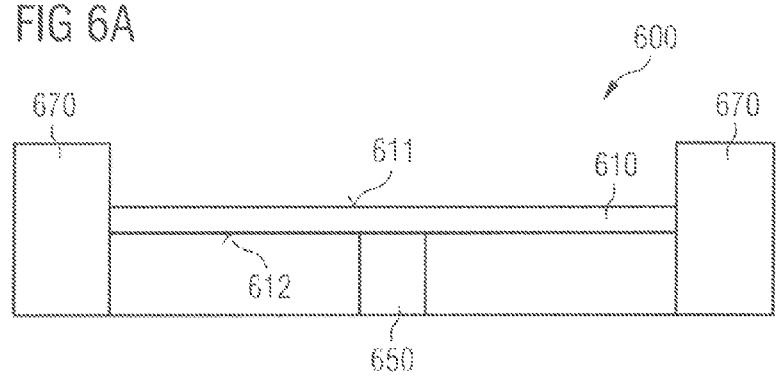
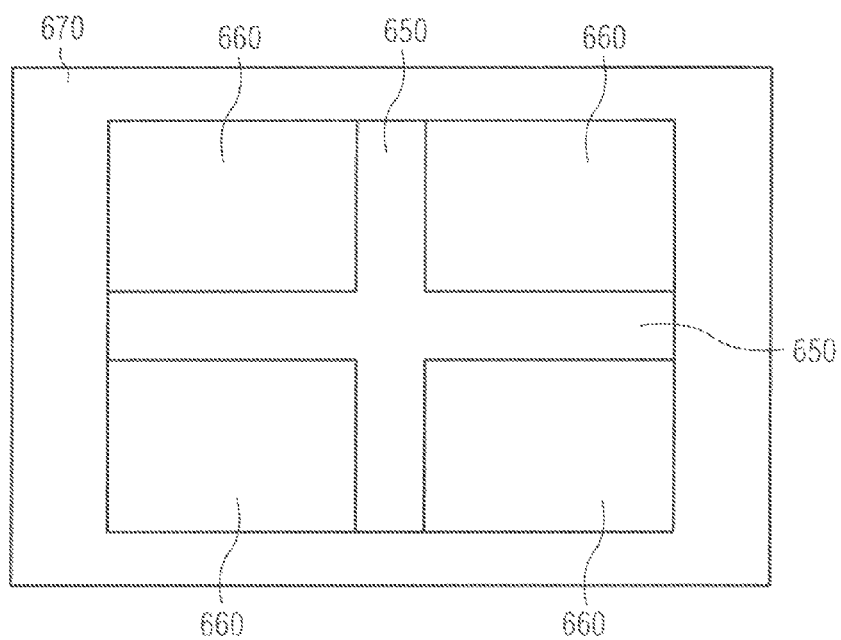

METHOD OF MANUFACTURING A SEMICONDUCTOR DEVICE

This is a divisional application of U.S. application Ser. No. 13/397,328, entitled "Method of Manufacturing a Semiconductor Device" which was filed on Feb. 15, 2012 and is incorporated herein by reference.

TECHNICAL FIELD

The present invention relates to a method of manufacturing a semiconductor device and to a semiconductor device.

BACKGROUND

There is an increasing market demand for smaller, lighter, more powerful electronic devices and electronic devices with higher power densities, especially for use in electrical converter devices for maximizing energy conversion efficiencies in, for example, solar or wind power stations. It has become increasingly important to minimize energy losses as caused by, for example, electrical resistances in these devices. The development of more compact semiconductor devices and those with increased functionality has led to thinner semiconductor chips and packaging technologies, such as wafer level packaging (WLP). The development of more compact semiconductor devices has in particular led to thinner electronic devices, in particular to thinner vertical power transistors. Typically, vertical power transistors have two contacts on one face and one contact on an opposing face and in the on stage, current flows from a source contact on one face to a drain contact on the other face. Therefore, the vertical power transistor exhibits an on resistance between the drain and source terminals so that manufacturing a thinner vertical power transistor is a possible way of decreasing the on resistance of the transistor.

BRIEF DESCRIPTION OF THE DRAWINGS

The accompanying drawings are included to provide a further understanding of the disclosure and are incorporated in and constitute a part of this specification. The drawings illustrate embodiments and together with the description serve to explain principles of the disclosure. Other variations and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a flow diagram for an exemplary method of manufacturing a semiconductor device according to a first aspect;

FIGS. 2A-2G show schematic cross-sectional side view representations (FIGS. 2A-2F) and a plan view representation (FIG. 2G) to illustrate an exemplary method of manufacturing a semiconductor device according to the disclosure;

FIGS. 3A, 3B show schematic cross-sectional side view representations to illustrate an exemplary method of manufacturing a semiconductor device according to the disclosure;

FIGS. 4A, 4B show schematic cross-sectional side view representations to illustrate an exemplary method of manufacturing a semiconductor device according to the disclosure;

FIGS. 5A, 5B show a schematic cross-sectional side view representation (FIG. 5A) and a plan view representation (FIG. 5B) of an electronic device according to a second aspect; and FIGS. 6A, 6B show a schematic cross-sectional side view representation (FIG. 6A) and a plan view representation (FIG. 6B) of an exemplary electronic device according to the disclosure.

DETAILED DESCRIPTION OF ILLUSTRATIVE EMBODIMENTS

Figure 2A:
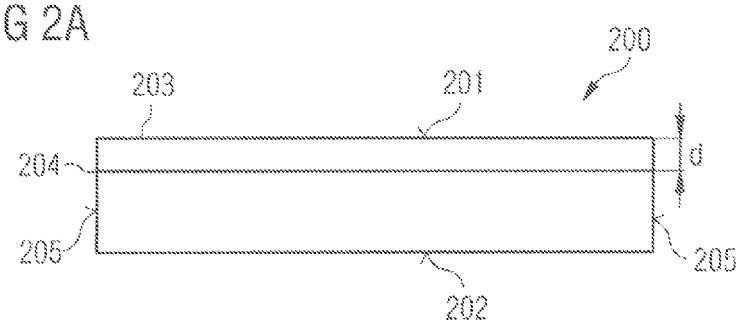

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the disclosure. It may be evident, however, to one skilled in the art that one or more aspects of the embodiments may be practiced with a lesser degree of the specific details. In other instances, known structures and elements are shown in schematic form in order to facilitate describing one or more aspects of the disclosure. It is to be understood that other embodiments may be utilized and structural or logical changes may be made without departing from the scope of the disclosure. It should be noted further that the drawings are not to scale or not necessarily to scale.

In addition, features or aspects disclosed may be combined with one or more other features or aspects of the other implementations as may be desired and advantageous for any given or particular application. The terms "coupled" and "connected," along with derivatives may be used. It should be understood that these terms may be used to indicate that two elements co-operate or interact with each other regardless of whether they are in direct physical or electrical contact, or they are not in direct contact with each other. The following detailed description, therefore, is not to be taken in a limiting sense, and the scope of the present invention is defined by the appended claims.

The examples of a method for fabricating a semiconductor device and the examples of a semiconductor device may use various types of semiconductor chips or circuits incorporated in the semiconductor chips, among them logic integrated circuits, analog integrated circuits, mixed signal integrated circuits, sensor circuits, MEMS (Micro-Electro-Mechanical-Systems), power integrated circuits, chips with integrated passives, etc. The embodiments may also use semiconductor chips comprising transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

In several examples, layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor package. The contact elements or contact pads may be made from any electrically conducting material, e.g., from a metal as aluminum, gold, or copper, for example, or a metal alloy, or an electrically conducting organic material, or an electrically conducting semiconductor material.

The semiconductor chips may become covered with an encapsulant or encapsulating material. The encapsulating material can be any electrically insulating material like, for example, any kind of molding material, any kind of epoxy material, or any kind of resin material. In special cases it could be advantageous to use a conductive encapsulant material. In the process of covering the semiconductor chips or dies with the encapsulating material, a wafer level packaging process can be carried out. Semiconductor chips can be arranged on a carrier having the form, e.g., of a wafer and will thus be called a "re-configured wafer" further below. However, it should be appreciated that the semiconductor chip carrier is not limited to the form and shape of a wafer but can have any size and shape and any suitable array of semiconductor chips embedded therein.

FIG. 1 illustrates a flow diagram of a method of manufacturing a semiconductor device according to a first aspect. The method 100 comprises providing a semiconductor chip having a first main face and a second main face opposite the first main face, wherein the semiconductor chip comprises an electrical device adjacent to the first main face (101), and selectively removing the semiconductor chip at the second main face except for a pre-defined portion (102).

According to an embodiment of the method 100 of FIG. 1, the electrical device can, for example, include a transistor, in particular one or more of a MOS transistor, a vertical transistor, a power transistor, a vertical power transistor, or an IGBT transistor. The transistor may comprise at least one contact element on one side and at least one contact element on the other side, in particular source and gate contacts on one side and a drain contact on the other side.

The semiconductor chip comprising the electrical device may have been pre-fabricated in a manner known in the art on a semiconductor wafer. Thereafter, the semiconductor chip may have been diced or sawn out of the semiconductor wafer so that it is a freely handable and placeable semiconductor chip. As such, the semiconductor chip can be, for example, placed by a pick-and-place machine on a suitable carrier for conducting all the process steps which will be described in more detail further below. According to an embodiment, the semiconductor chip can be placed on the carrier together with a plurality of other semiconductor chips which can be identical in form and function with the one semiconductor chip.

According to an embodiment of the method 100 of FIG. 1, the pre-defined portion can be arranged symmetrical to a center axis of the semiconductor chip like, for example, in the form of a cross which is shown in an embodiment below.

According to an embodiment of the method 100 of FIG. 1, the pre-defined portion may include or may consist of a circumferential edge portion.

According to an embodiment of the method 100 of FIG. 1, selectively removing the semiconductor chip at the second main face can be performed in principle by any mechanical material working methods like, for example, drilling, grinding, polishing, etc. One example of removing of the semiconductor material is chemical mechanical polishing (CMP).

According to an embodiment of the method 100 of FIG. 1, selectively removing the semiconductor chip at the second main face can, for example, be performed by etching as, for example, reactive etching, chemical etching, plasma etching, ion beam etching or reactive ion beam etching. In order that the etching automatically stops at a desired location, an etch stop region can be formed in the semiconductor chip. The etch stop region can, for example, be formed by selectively doping the semiconductor chip from the first main face. By the doping process a layer of relatively high doping concentration can be generated in the semiconductor chip in a desired distance from the first main face. The doping can be performed by, for example, ion implantation doping or as well by diffusion doping. The doping leads to a significant reduction of the etching rate of the doped semiconductor material as compared to undoped semiconductor material so that etching automatically stops when the doping zone is reached.

According to an embodiment of the method 100 of FIG. 1, a mask layer can be applied on the circumferential edge portion of the second main face. The mask layer should be sufficiently resistant against the etching agent so that it is guaranteed that the semiconductor material adjacent to the mask layer is not removed by the etching process. If the etching is carried out by any sort of directional etching like, for example, ion beam etching, it is also guaranteed that no underetching of semiconductor material below the mask layer will take place.

According to an embodiment of the method 100 of FIG. 1, it can be further provided that an encapsulation layer is applied onto the semiconductor chip before selectively removing the semiconductor chip at the second main face. The encapsulation layer can be applied in different ways onto the semiconductor chip. Embodiments will be shown and described below which basically differ from each other in the way of applying and processing the encapsulation layer.

According to an embodiment of the method 100 of FIG. 1, the selective removing of the semiconductor chip is carried out until a thickness of the semiconductor chip between the first and second main faces is reached which is less than 100 µm.

According to an embodiment of the method 100 of FIG. 1, the pre-defined portion can in particular have stabilizing or stiffening functions in order to support and stabilize the thin semiconductor chip. For that purpose the pre-defined portion can be arranged symmetrical with respect to a central axis of the semiconductor chip. The pre-defined portion can, for example, have the form of a cross in a top view which will be shown in an embodiment below.

According to an embodiment of the method 100 of FIG. 1, the pre-defined portion can be arranged according to one or more of the nature, the functionality and the structure of the electrical device. In particular, if the electrical device includes a transistor like, for example, a vertical transistor, and if the electrical device also includes further devices, elements or circuits like logic circuits, it could be advantageous to thin the semiconductor chip only in the area of the vertical transistor so that the pre-defined portion is essentially comprised of the remaining area where a thinning is not necessary and not even desirable. In the remaining area there can be, for example, a memory like a flash memory, a passive device or some logic circuitry adjacent to the main face so that there is no need for thinning and for removing the semiconductor material below these devices.

According to an embodiment of the method 100 of FIG. 1, an electrical contact element is applied to the second main face, in particular to a contact pad on the second main face, after the step of selectively removing the semiconductor chip. In particular, if only an area below a vertical power transistor has been removed, a metal contact layer can be filled into the empty space in order to make contact to the lower electrode, in particular the drain electrode of the vertical power transistor.

In FIGS. 2A-2G an example is illustrated in which an encapsulation layer is applied onto the first main face and side faces of the semiconductor chip which connect the first main face and the second main face. As a result the encapsulation layer comprises a first main face which faces the first main face of the semiconductor chip and a second main face which is coplanar with the second main face of the semiconductor chip.

FIG. 2A illustrates a schematic cross-sectional side view representation of a semiconductor chip 200. The semiconductor chip 200 comprises a first main face 201 and a second main face 202 and side faces 205 connecting the first main face 201 and the second main face 202. A protection layer 203 is provided at the first main face 201. In a distance d from the first main face 201, an etch stop layer 204 is provided. The etch stop layer 204 can be comprised of a layer of relatively high doping level within the semiconductor material of the semiconductor chip 200. The semiconductor chip 200 may comprise an electrical device like a vertical transistor between the etch stop layer 204 and the first main face 201. The doped etch stop layer 204 may, in addition, function as an electrode layer of the vertical transistor.

Figure 2B:
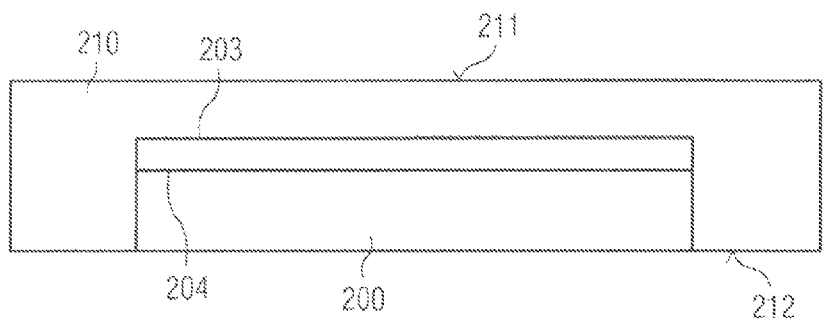

FIG. 2B shows the semiconductor chip 200 being encapsulated by an encapsulation layer 210. The encapsulation layer is applied in such a way to the semiconductor chip 200 that it covers the first main face 201 and the side faces 205 of the semiconductor chip 200. The encapsulation layer 210 thus comprises a first main face 211 which faces the first main face 201 of the semiconductor chip 200, and a second main face 212 which is coplanar with the second main face 202 of the semiconductor chip 200. As can be seen in the plan view of FIG. 2G, the semiconductor chip 200 may have a rectangular, in particular quadratic form, comprising four side faces 205 wherein all four side faces 205 are covered by the encapsulation layer 210. The encapsulation layer 210 can, for example, be comprised of a resin material like, for example, an epoxy resin material.

Figure 2C:
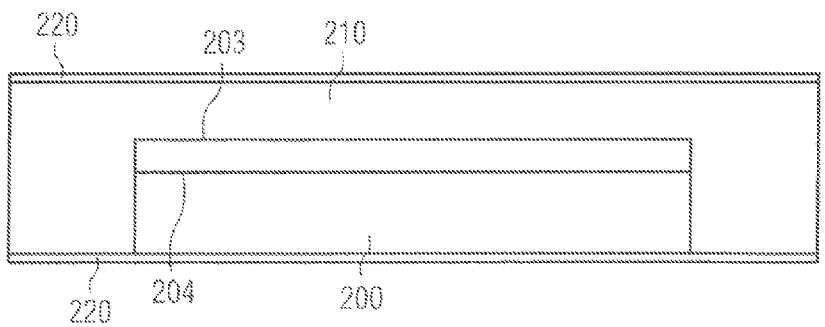

FIG. 2C shows the encapsulated semiconductor chip 200 after the application of a photosensitive layer 220 on the first main face 211 and the second main face 212 of the encapsulation layer 210.

Figure 2D:
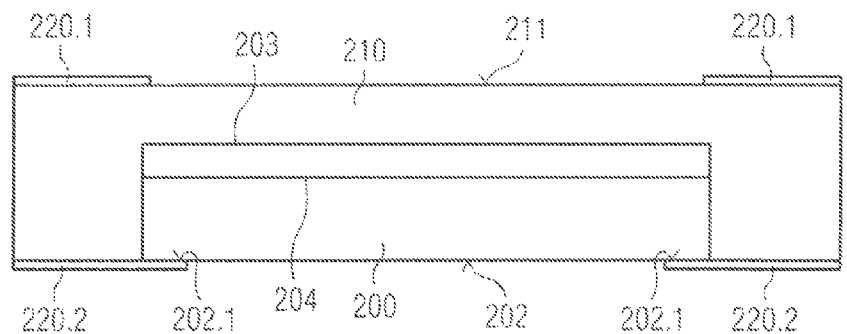

FIG. 2D shows the encapsulated semiconductor device after structuring of the photosensitive layer 220. The photosensitive layer 220 is structured in such a way that on the first main face 211 of the encapsulation layer 210 a photosensitive layer 220.1 is obtained which is essentially a mask layer for masking a region under the photosensitive layer 220.1 in which there is no semiconductor chip vertically below the photosensitive layer 220.1. On the second main face 212 of the encapsulation layer 210 and the second main face 202 of the semiconductor chip 200, the photosensitive layer is structured in such a way that a photosensitive layer 220.2 is obtained which completely covers the second main face 212 of the encapsulation layer 210 and in addition a circumferential edge portion 202.1 of the second main face 202 of the semiconductor chip 200. As can be seen in the top view of FIG. 2G, the circumferential edge portion 202.1 and the corresponding circumferential projection 230 is a ring-like closed circumferential edge portion.

Figure 2E:
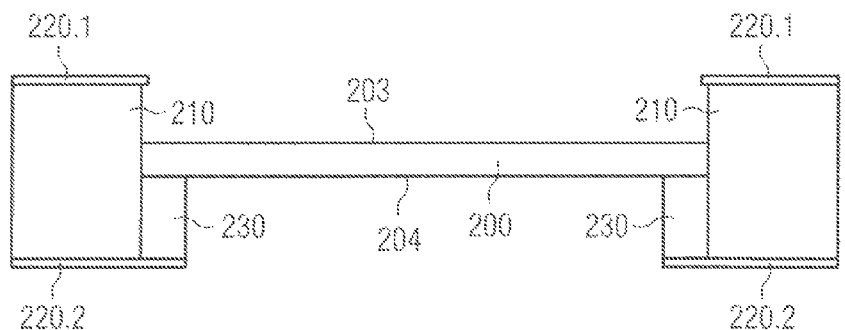

FIG. 2E shows the encapsulated device after removing those portions of the encapsulation layer 210 and the semiconductor chip 200 which had not been masked by the photosensitive layers 220.1 and 220.2. In particular, a portion of the encapsulation layer 210 reaching from the first main face 201 of the semiconductor chip 200 until the first main face 211 of the encapsulation layer 210 is removed by, for example, etching. Likewise a portion of the semiconductor chip 200 reaching from the second main face 202 of the semiconductor chip 200 until the etch stop layer 204 is removed except for a circumferential projection portion 230 which has been left behind due to the masking of the circumferential edge portion 202.1 by the photosensitive layer 220.2. The etching of these portions of the encapsulation layer 210 and the semiconductor chip 200 can be performed by any conventional directional etching method like, for example, ion beam etching or reactive ion beam etching. The height of the circumferential projection 230 can be in a range from 100 μm to 700 μm. It is also possible that not the complete portion of the encapsulation layer 210 reaching from the first main face 201 of the semiconductor chip 200 until the first main face 211 of the encapsulation layer 210 is removed but that instead there is some lateral spatial selectivity for whatever reason.

Figure 2F:
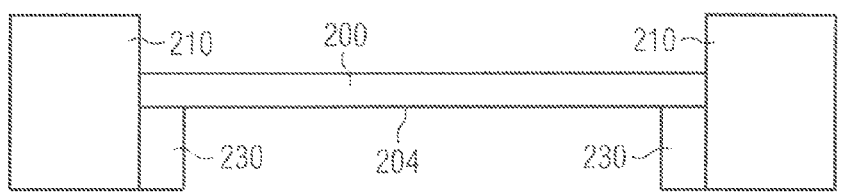

FIG. 2F shows the encapsulated device after removing of the photosensitive mask layers 220.1 and 220.2 and also removing of the protective layer 203 on the first main face 201 of the semiconductor chip 200. In a next process step electrical contact pads on the first main face 201 and the second main face 202 of the semiconductor chip 200 can be connected with suitable electrical contact elements. For example, metallic contact elements can be formed upon the contact pads of the semiconductor chip 200 and connected by means of, for example, a redistribution layer with external electrical contact elements of the semiconductor device. The resulting semiconductor chip 200 may comprise a thickness of about 100 μm. FIG. 2G shows a plan view of the device as shown in FIG. 2F.

FIGS. 3A, 3B illustrate schematic, cross-sectional side view representations of another example of a method for fabricating a semiconductor device. The difference with respect to the previous embodiment is that a circumferential protection is to be fabricated which is smaller in height than the circumferential projection 230.

FIG. 3A shows an encapsulated device 300 which is in principle similar to that shown in FIG. 2D. The difference is that in a previous step the device, like that shown in FIG. 2B, has been thinned by removing the encapsulation layer 310 and the semiconductor chip 300 from their respective second main faces 312 and 302. The removing can be done either by grinding or chemical-mechanical polishing (CMP). In this way, the semiconductor chip 300 can be thinned down to a thickness of about 200 μm. Thereafter, a structured photosensitive layer 320.2 can be applied onto the second main face 312 of the encapsulation layer 310 and a circumferential edge portion 320.1 of the second main face 302 of the semiconductor chip 300.

FIG. 3B shows the resulting semiconductor device after conducting the same steps as described in connection with FIGS. 2B and 2F. As a result, a semiconductor chip is obtained, the thickness of which is about 100 μm, whereas the height of the circumferential projection 330 can be in a range from 100 μm to 200 μm.

FIGS. 4A, 4B illustrate schematic, cross-sectional side view representations of an example of a method for fabricating a semiconductor device in which the encapsulation layer is applied onto the second main face of the semiconductor chip and side faces connecting the first main face and the second main face of the semiconductor chip before selectively removing the semiconductor chip at the second main face. As a result, the encapsulation layer comprises a first main face which is coplanar with the first main face of the semiconductor chip and a second main face which faces the second main face of the semiconductor chip.

FIG. 4A shows a semiconductor chip 400 which can be similar in form and function as the semiconductor chips 200 and 300 of the previous embodiments. The semiconductor chip 400 comprises a first main face 401 and a second main face 402 and side faces 405 and a protective layer 420 is deposited on the first main face 401. Moreover, an encapsulation layer 410 is applied onto the second main face 402 and side faces 405 which connect the first main face 401 and the second main face 402 so that the encapsulation layer 410 comprises a first main face 411 which is coplanar with the first main face 401 of the semiconductor chip 400 and a second main face 412 which faces the second main face 402 of the semiconductor chip 400. An etch stop layer 404 is generated in the semiconductor chip 400 in a distance from the first main face 401 in the same way as was already explained in the previous embodiments.

FIG. 4B shows the encapsulated device after selectively removing a portion of the encapsulation layer 410 and selectively removing a portion of the semiconductor chip 400. First the encapsulation layer 410 is removed from the second main face 412 by, for example, grinding or chemical-mechanical polishing until the second main face 402 of the semiconductor chip 400 is reached or even further, if a circumferential projection 430 is desired which is smaller in height. Then a photosensitive layer is applied on the second main face of the encapsulation layer 410, which is coplanar with the second main face 402 of the semiconductor chip 400 and, thereafter, the photosensitive layer is structured so that it masks only the encapsulation layer 410 and a circumferential portion of the second main face 402 of the semiconductor chip 400. Then the semiconductor chip 400 is etched from the second main face 402 until the etch stop layer 404 is reached. This exemplary method can be combined with any feature or embodiment which was described above in connection with FIGS. 1 to 3.

FIGS. 5A, 5B show a schematic, cross-sectional side view representation (FIG. 5A) and a plan view representation (FIG. 5B) of a semiconductor device according to a second aspect. The semiconductor device 500 comprises a semiconductor chip 510 having a first main face 511 and a second main face 512 opposite the first main face 511, and a projection 520 extending in a right angle with respect to the plane of the second main face 512.

According to an embodiment of the semiconductor device 500 of FIG. 5, the projection 520 can be configured as a circumferential projection connected to a circumferential edge portion 512.1 of the second main face 512 of the semiconductor chip 510. The projection can, however, comprise any other form and shape.

According to an embodiment of the semiconductor device 500, the semiconductor chip 510 comprises a doped layer 530 at the second main face 512. The doped layer 530 may result from an etch stop layer previously fabricated and employed for fabricating the semiconductor device 500. The doped layer 530 can be used as an electrode layer for an electrical device like, for example, a vertical transistor incorporated in the semiconductor chip 510.

According to an embodiment of the semiconductor device 500, the device further comprises an encapsulation layer 550 attached in a circumferential manner to all side faces 505 of the semiconductor chip 510. The encapsulation layer 550 can be made of any one of the materials as were previously indicated in connections with FIGS. 1 to 4. A lower face of the encapsulation layer 550 can be coplanar with a lower face of the projection face 520. However, it can also be the case that the lower face of the encapsulation layer 550 exceeds beyond the lower face of the projection 520.

According to an embodiment of the semiconductor device 500, the semiconductor chip 510 comprises an electrical device 540. The electrical device 540 can, for example, be comprised of a vertical transistor having electrode terminals 531 and 532 on the first main face 511 and an electrode terminal on the second main face 512 which can, for example, be comprised of the doped layer 530.

According to an embodiment of the semiconductor device 500, the circumferential projection 520 is comprised of the semiconductor material of the semiconductor chip 510, and is formed contiguous with the semiconductor chip 510 as the semiconductor device 500 can be formed by a method as was outlined in connection with one of the previous FIGS. 1-4.

According to an embodiment of the semiconductor device 500, a thickness of the semiconductor chip 510 between the first main face 511 and the second main face 512 is below 100 μm. According to an embodiment, the projection 520 can have a height in a range from 100 μm to 700 μm.

FIGS. 6A, 6B show a schematic, cross-sectional side view representation (FIG. 6A) and a plan view representation (FIG. 6B) of a semiconductor device according to the disclosure. The semiconductor device 600 comprises a semiconductor chip 610 having a first main face 611 and a second main face 612 opposite the first main face 611.

The semiconductor device 600 comprises a projection 650 connected to the second main face 612 and extending in a right angle to the plane of the second main face 612 of the semiconductor chip 610. The projection 650 can be fabricated in the same way as the circumferential projection 670 of the previous embodiment of FIG. 5 and as explained in connection with FIGS. 1 to 5, namely by applying a mask layer like the photosensitive mask layer 220.2 in FIG. 2D onto the second main face of the semiconductor chip, the mask layer having the purpose to mask those portions which are not to be etched. Therefore, the projection 650 is comprised of the same semiconductor material as the semiconductor chip 610 and is also contiguous with the semiconductor chip 610. As can be seen in the plan view representation of FIG. 6B, the projection 650 can have the form of a cross which means that during the fabrication process only the four areas designated with reference sign 660 are removed by the etching process. It is also possible that the semiconductor chip 610 comprises more than one electrical device as, for example, four electrical devices each of which is located in one of the four areas 660. The etched away portions in the areas 660 can then be used to fill in an electrically conductive material to contact the lower electrode terminals of the four electrical devices.

The projection 650 can, however, have any other desired form and structure. It may be arranged symmetrical with respect to a central axis of the semiconductor chip but it may also follow other structural or design concepts. For example, as it was indicated above, that the projection 650 can be present in portions which need not to be thinned like, for example, logic circuit portions or memory portions of the one or more electrical devices of the semiconductor chip whereas other portions of the semiconductor chip where a vertical transistor is present have been thinned.

While the invention has been illustrated and described with respect to one or more implementations, alterations and/or modifications may be made to the illustrated examples without departing from the spirit and scope of the appended claims. In particular with regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A semiconductor device comprising:
   a semiconductor chip having a first main face and a second main face opposite the first main face; and
   a projection connected to the second main face of the semiconductor chip, the projection extending in a right angle with respect to a plane of the second main face, wherein the projection is made of a semiconductor material and is continuous with the semiconductor chip and an integral part of the semiconductor chip.

2. The semiconductor device according to claim 1, wherein the projection comprises a circumferential projection connected to a circumferential edge portion of the second main face.

3. The semiconductor device according to claim 2, wherein a thickness of the semiconductor chip between the first and the second main faces is less than 100 μm.

4. The semiconductor device according to claim 2, further comprising an encapsulation layer applied to side faces of the semiconductor chip.

5. The semiconductor device according to claim 1, further comprising a doped layer at the second main face.

6. A semiconductor device comprising:
   a semiconductor chip comprising a first main face and a second main face; and
   an encapsulation body comprising a first main face and a second main face, wherein the encapsulation body laterally surrounds the semiconductor chip such that the first main face of the semiconductor chip is exposed from the encapsulation body and the second main face of the semiconductor chip is exposed from the encapsulation body, wherein a first portion of the second main face of the semiconductor chip is coplanar with the second main face of the encapsulation body, and wherein the first portion of the second main face of the semiconductor chip is symmetrical to a center axis of the semiconductor chip.

7. The semiconductor device according to claim 6, wherein the first main face of the encapsulation body is spaced apart from the first main face of the semiconductor chip by a first distance, and wherein the second main face of the encapsulation body is spaced apart from a second portion of the second main face of the semiconductor chip by a second distance.

8. The semiconductor device according to claim 7, wherein the first distance and the second distance is the same.

9. The semiconductor device according to claim 8, wherein the first distance is between 100 μm and 700 μm.

10. The semiconductor device according to claim 6, wherein the semiconductor chip comprises a thickness of less than 100 μm.

11. The semiconductor device according to claim 6, wherein the first portion of the second main face forms a cross.

12. The semiconductor device according to claim 6, wherein the first portion of the second main face forms a circumferential edge portion.

13. The semiconductor device according to claim 6, wherein a first electrode terminal and a second electrode terminal is disposed on the first main face of the semiconductor chip, and wherein a third electrode terminal is disposed on the second main face of the semiconductor chip.

14. The semiconductor device according to claim 6, wherein a first electrode terminal is disposed on the first main face of the semiconductor chip, and wherein a second electrode terminal and a third electrode terminal is disposed on the second main face.

15. The semiconductor device according to claim 6, wherein the semiconductor chip comprises a vertical transistor.

16. A semiconductor device comprising:
   a semiconductor chip comprising a first main face and a second main face, the semiconductor chip having a recess in the second main face; and
   an encapsulation body comprising a first main face and a second main face, wherein the encapsulation body laterally surrounds the semiconductor chip, wherein the first main face of the semiconductor chip is spaced apart from the first main face of the encapsulation body, and wherein the second main face of the semiconductor chip is coplanar to the second main face of the encapsulation body.

17. The semiconductor device according to claim 16, wherein the semiconductor chip comprises a thickness of less than 100 μm.

18. A semiconductor device comprising:
   a semiconductor chip comprising a first main face and a second main face; and
   an encapsulation body comprising a first main face and a second main face, wherein the encapsulation body laterally surrounds the semiconductor chip such that the first main face of the semiconductor chip is exposed from the encapsulation body and the second main face of the semiconductor chip is exposed from the encapsulation body, wherein a portion of the second main face of the semiconductor chip is coplanar with the second main face of the encapsulation body, and wherein the portion of the second main face forms a cross.

19. A semiconductor device comprising:
   a semiconductor chip comprising a first main face and a second main face; and
   an encapsulation body comprising a first main face and a second main face, wherein the encapsulation body laterally surrounds the semiconductor chip such that the first main face of the semiconductor chip is exposed from the encapsulation body and the second main face of the semiconductor chip is exposed from the encapsulation body, wherein a portion of the second main face of the semiconductor chip is coplanar with the second main face of the encapsulation body, wherein a first electrode terminal and a second electrode terminal is disposed on the first main face of the semiconductor chip, and wherein a third electrode terminal is disposed on the second main face of the semiconductor chip.

20. A semiconductor device comprising:
   a semiconductor chip comprising a first main face and a second main face; and
   an encapsulation body comprising a first main face and a second main face, wherein the encapsulation body laterally surrounds the semiconductor chip such that the first main face of the semiconductor chip is exposed from the encapsulation body and the second main face of the semiconductor chip is exposed from the encapsulation body, wherein a portion of the second main face of the semiconductor chip is coplanar with the second main face of the encapsulation body, wherein a first electrode terminal is disposed on the first main face of the semiconductor chip, and wherein a second electrode terminal and a third electrode terminal is disposed on the second main face.

* * * * *